(12) United States Patent
Voss

(10) Patent No.: US 7,471,175 B2
(45) Date of Patent: Dec. 30, 2008

(54) PLANAR MIXED-SIGNAL CIRCUIT BOARD

(75) Inventor: John D. Voss, Cumming, GA (US)

(73) Assignee: EMS Technologies, Inc., Norcross, GA (US)

(*) Notice: Subject to any disclaimer, the term of this patent is extended or adjusted under 35 U.S.C. 154(b) by 74 days.

(21) Appl. No.: 11/796,148

(22) Filed: Apr. 26, 2007

(65) Prior Publication Data

US 2007/0262836 A1 Nov. 15, 2007

Related U.S. Application Data

(60) Provisional application No. 60/794,968, filed on Apr. 26, 2006.

(51) Int. Cl.
*H01P 1/00* (2006.01)
(52) U.S. Cl. ..................... 333/247; 333/245
(58) Field of Classification Search ......... 333/236–240, 333/245–247
See application file for complete search history.

(56) References Cited

U.S. PATENT DOCUMENTS

| 2007/0218951 A1* | 9/2007 | Risheq et al. ............. 455/562.1 |
| 2008/0074324 A1* | 3/2008 | Puzella et al. ......... 343/700 MS |
| 2008/0164874 A1* | 7/2008 | White et al. ................. 324/316 |

* cited by examiner

*Primary Examiner*—Don P Le
(74) *Attorney, Agent, or Firm*—King & Spalding LLP

(57) ABSTRACT

A mixed-signal circuit board can provide a flexible arrangement of multiple RF transmission mediums in a single lightweight and compact structure as well as support embedding electronic devices within RF transmission paths. The transmission mediums may include a voided waveguide, a dielectric waveguide, a microstrip, a suspended microstrip, a traditional stripline, and a suspended stripline. The center conductors in each transmission medium may be constructed on the same plane or the same PCB layer in order to simplify coplanar design. A distribution board can be provided to deliver the power supply and control signals to the active electronic devices placed in the signal path of the RF board for signal processing and within covered cavities provided within the RF board.

20 Claims, 12 Drawing Sheets

PLANAR MIXED-SIGNAL CIRCUIT BOARD

RELATED APPLICATION

This patent application claims priority under 35 U.S.C. § 119 to U.S. Provisional Patent Application No. 60/794,968, entitled "Planar Mixed-Signal Circuit Board," filed Apr. 26, 2006. The complete disclosure of the above-identified priority application is hereby fully incorporated herein by reference.

FIELD OF THE INVENTION

The present invention relates to mixed-signal printed circuit boards that support radio-frequency signal transmission. More specifically, the present invention relates to planar, mixed-signal circuit boards that provide a flexible arrangement of multiple RF transmission mediums in a single lightweight and compact structure as well as support embedding electronic devices within RF transmission paths.

BACKGROUND

Circuit boards provide both mechanical support and electrical interconnection of electronic components. Circuit boards generally use conductive traces etched from copper that has been laminated onto a non-conductive substrate. Circuit boards in radio frequency (RF) applications can use specially designed traces such as stripline or microstrip traces. These RF trace techniques may be used to control the transmission line characteristics, such as impedance, for traces that conduct RF signals.

Traditionally, a stripline trace is positioned within the layers of a printed circuit board (PCB) with a ground plane above and a ground plane below. In contrast, a microstrip trace is typically positioned on, or near, a surface layer of the PCB. As such, the conductors of the two trace types are generally on different PCB layers. Interconnection of such conductors on different PCB layers can be complicated and is generally achieved with one or more vias or plated holes placed through the board within an area where the conductors overlap. The geometries of the vias, contrasted to the geometries of the traces, often introduce undesirable discontinuities in impedance and other transmission line characteristics. Such imperfections in a signal path can increase noise and reduce the maximum operating frequency of the circuit.

Having a laminated planar structure, there is limited opportunity to provide vertical conductive elements, aside from vias, within the traditional PCB. As such, the construction of waveguide transmission paths is generally not supported. Furthermore, vertical shielding is limited. Due to this limited shielding, increased signal isolation generally requires increased distanced between traces, thereby increasing size, weight, and cost of the PCB.

Traditionally, electronic RF devices may be positioned upon a PCB. The height discontinuity between surrounding traces and the pads at the top of the device can introduce undesired signal effects when interconnecting the devices to the PCB traces. Furthermore, the routing of power and control signals to such devices can be quite complicated and is often accomplished at the expense of isolation, mass, and size.

Accordingly, there is a need in the art for a mixed-signal circuit board that can simultaneously support multiple transmission path technologies such as stripline, microstrip, suspended stripline, suspended microstrip, and waveguide while providing simplified transitions between paths of different transmission types. There is a further need in the art for the circuit board to support increased isolation between the transmission paths. There is yet another need in the art for the circuit board to support efficiently embedding electronic components within the transmission paths while simplifying the routing of control and power traces to the electronic components and without compromising signal path isolation.

SUMMARY

The present invention supports a light-weight, planar mixed-signal multi-layer board for the transmission of RF signals over a very broad operating frequency band extending into millimeter wave frequencies. The mixed signals may include RF, DC, and digital signals. The board technology allows the designer to choose the transmission path type that is best suited for any particular section or transmission path in the board.

The simplified design of the present invention provides a faster, more flexible and less expensive method of manufacturing one or more different types of microwave transmission paths or mediums on a single board. Because all the center conductor trace elements are co-planar, they can be manufactured as a single layer, regardless of the ultimate intended transmission medium for any given section of the board. The layered RF board, including the traces, can typically be manufactured by a single vendor. Thus, second-stage assembly is limited essentially to the installation of monolithic microwave integrated circuit (MMIC) dies or other electronic devices and application of the cavity covers.

The discussion of mixed-signal circuit board technologies presented in this summary is for illustrative purposes only. Various aspects of the present invention may be more clearly understood and appreciated from a review of the following detailed description of the disclosed embodiments and by reference to the drawings and the claims that follow. Moreover, other aspects, systems, methods, features, advantages, processes, and objects of the present invention will become apparent to one with skill in the art upon examination of the following drawings and detailed description. It is intended that all such aspects, systems, methods, features, advantages, processes, and objects are within the scope of the present invention, and are to be protected by the accompanying claims.

Figure 1:
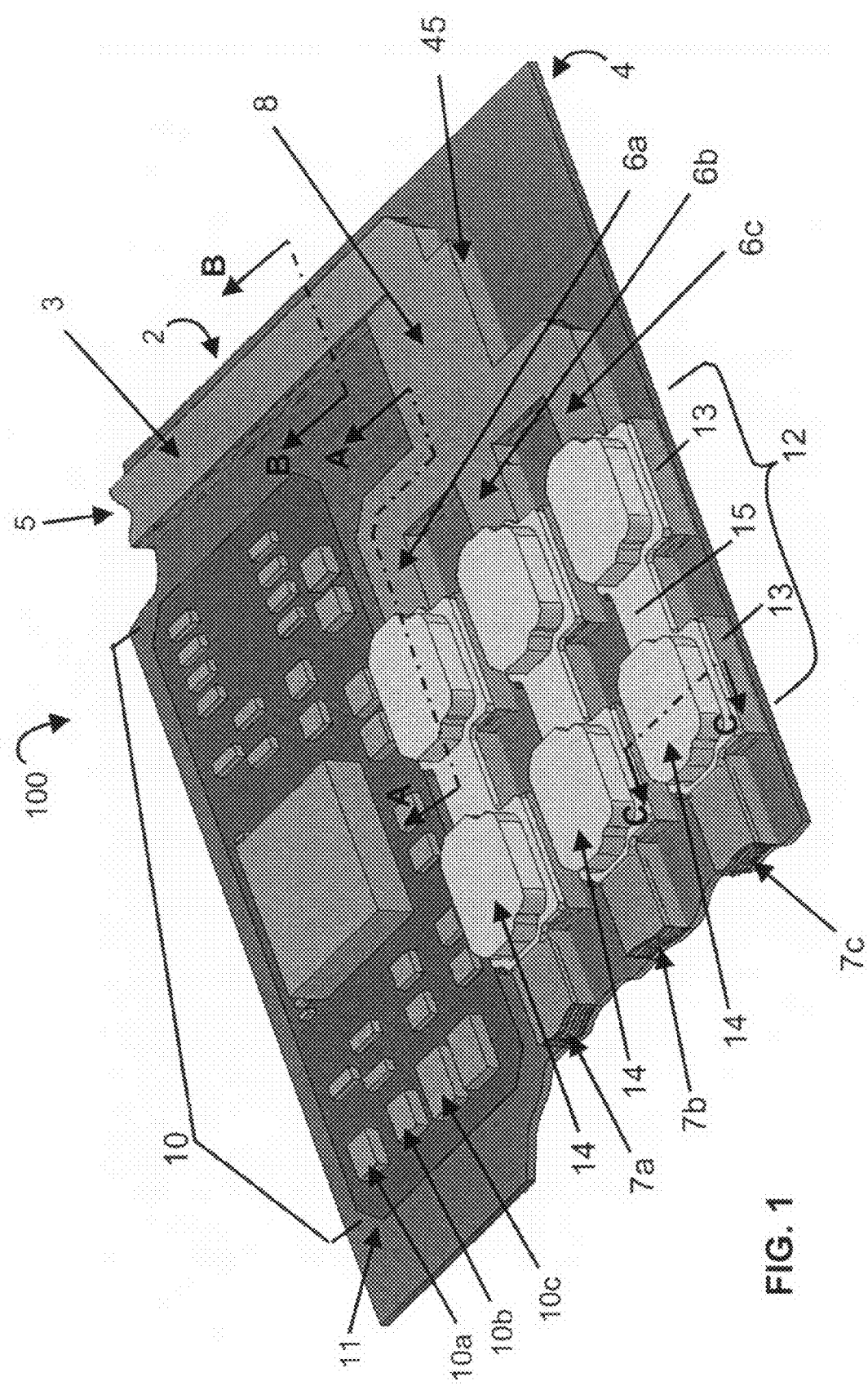
FIG. 1 illustrates a mixed-signal board having an RF board mounted on a distribution board according to one exemplary embodiment of the invention.

Many aspects of the invention can be better understood with reference to the above drawings. The elements and features shown in the drawings are not to scale, emphasis instead being placed upon clearly illustrating the principles of exemplary embodiments of the present invention. Moreover, certain dimension may be exaggerated to help visually convey such principles. In the drawings, reference numerals designate like or corresponding, but not necessarily identical, elements throughout the several views.

DETAILED DESCRIPTION OF EXEMPLARY EMBODIMENTS

The present invention supports a planar mixed-signal, multi-layer circuit board for the transmission of RF signals over a very broad operating frequency band extending into millimeter wave frequencies, for example 10 GHz up to 80 GHz. The board can be efficiently constructed using conventional microwave and digital printed circuit board materials. The same board, also referred to as a printed circuit board or PCB, may support the use of dielectric void waveguide, dielectric core waveguide, suspended stripline, traditional stripline, microstrip and suspended microstrip transmission mediums.

The present invention may support co-planar board construction. That is, the center conductors in each microstrip transmission medium may be constructed on the same plane or the same PCB layer. Thus, one common RF circuit trace can be etched and interchangeably formed into a stripline, microstrip, suspended microstrip, or suspended stripline transmission medium. A waveguide transmission medium, of either a dielectric void or a dielectric-filled inner structure, can also be built using the same layered technique within a single board supporting RF signal distribution, i.e., an RF board or RF circuit board.

A distribution board, also referred to herein as a distribution circuit board, can be used to deliver the power supply and control signals to each active electronic device placed in the signal path of the RF board for signal processing. The distribution board can have wire-bondable pads accessible through an aperture cut through a section of the entire RF board to facilitate signal interconnections to the active device.

Cavities within the RF board can provide work areas for inserting active devices for signal processing, with the cavity having access holes for coupling power and control signals to the active device without incurring loss of isolation between signal paths. The RF board can support the simplified placement of electronics device into a pocket of the cavity. The depth of the pocket can be designed to provide co-planar connection points to establish connection between the channel and the electronics device. The transition within a channel to the active electronics device can just as easily be made from a waveguide transmission line, which first transitions to a microstrip feed then to the active device. When multiple active devices, such as MMIC dies, are used in series, the user has the choice of which transmission medium to use between the devices to give optimum signal transmission performance.

Depending of the circuit application, the MMIC die can easily be substituted by an RF or Microwave Module containing multiple MMICs and control dies, connected with wirebonds, and hermetically sealed. In this substitution case, two or more RF connections could exist at a single Microwave Module.

The RF board can support high signal isolation by using individual channels that can be completely encapsulated with an electrically conductive barrier material. Such edge plating of the vertical walls throughout the RF board can provide superior channel-to-channel isolation. For example up to 70-80 dB of isolation can be achieved with this edge plating approach. Cavity covers attached over the cavities formed in the RF board typically use conductive epoxy or solder to produce a Faraday Cage electronic enclosure for optimum isolation.

Details of these and other novel features of the innovative mixed signal board design are given in the following detailed description and with reference to its accompanying drawings.

Turning now to the drawings, in which like reference numerals refer to like (but not necessarily identical) elements, FIG. 1 illustrates a mixed-signal board 100 having an RF board 2 mounted on a distribution board 4 according to one exemplary embodiment of the invention. The RF board 2 can also be referred to as a multiguide board. The distribution board 4 can also be described as a power and control signal distribution board because power and control signals may be routed through paths on this board to connect to active electronic devices on, or in, the RF board 2.

In the illustrated embodiment, the RF board 2 includes an input transmission line section 3 that can receive a signal at an input port 5, a wider component section 8, followed by three channel sections 6a, 6b, and 6c that can output signals at ports 7a, 7b and 7c. The RF board 2 can support any other topology of channels, arms, branches, splitters, and combiners. The RF board 2 can be directional or bidirectional.

The RF board 2 can be formed by laminating together multiple layers of microwave printed circuit board (PCB) material. Any microwave or RF circuit board material known in the art may be used to form the RF board 2. Examples of such materials are: R04003C, RT/DUROID 6002, 5870, 5880, any other RF PCB material, or layered combinations thereof.

The RF board 2 may be constructed by building-up laminated layers of PCB. For example, the RF board 2 may be constructed by cutting individual board layers. Each layer is cut and shaped to form cavity areas and apertures as needed in the RF transmission paths. After cutting, the layers are laminated together. The cutting may be performed by mechanical cutter, laser, water, chemical, or by any other techniques to cut PCBs. The RF board 2 may also be constructed by laminating the PCB layers together prior to cutting out the transmission path sections, or by any other technique. For example the PCB cutting and layer lamination may be combined into one process.

Once laminated, the RF board 2 may be edge-plated with a conductive material such as copper, silver, or any other metal or alloy. This plating can provide shielding, including vertical shield walls. Such shielding can reduce electromagnetic interference (EMI) and improve isolation. Isolation may be between two or more RF signal paths, between an RF signal path and other components on the RF board 2 or the distribution board 4, or between an RF signal path and outside systems, components, cables, or other signal sources, carriers, or radiators. The edge-plating of the RF board 2 may also provide the vertical walls of waveguide transmission paths.

After edge-plating, the RF board 2 may then be machined to expose any internal component cavities and access holes as necessary. The RF board 2 may then be secured to the supporting structure of distribution board 4 using a polyimide layer, or other conventional dielectric, or conductive bonding material, on the distribution board 4. The distribution board 4 may have been processed or formed independently from the processing or forming of the RF board 2.

The RF board 2 can support increased flexibility in designing circuit paths and in embedding components into the RF board 2 to suit the system design. The RF board 2 can support the insertion of active signal processing devices into RF circuit paths while providing increased shielding and isolation. The RF board 2 may support the simplified interconnection of different transmission mediums throughout the RF board 2. As such, the RF board 2 can support selecting the favorable transmission path characteristics for each section of a circuit or system. Each transmission type has its own characteristics that may make it preferable for certain functions. For example, suspended stripline and suspended microstrip have superior low-loss properties when compared to traditional, or non-suspended, stripline and microstrip circuits. Microstrip is convenient to use where connections need to be made from the center conductor to an external transmission path. Representative examples include the input and output ports of the RF board 3 or within a cavity section of the RF board 2 for making the connections to an electronic component. The traditional stripline, because it has no voids or openings, may be useful as an interface or debris blocker when transitioning from microstrip to suspended stripline. Waveguide is yet another transmission line type that may be preferred in certain situations.

The distribution board 4, upon which the RF board 2 is mounted, can also be a PCB and may be a traditional fiber resin board such as one formed from FR4 material. The distribution board 4 may also be any type of RF or microwave PCB material. The distribution board 4 may be formed of multiple PCB layers. Although illustrated as a rigid PCB, the distribution board 4 could be formed as a flexible substrate, or as a rigid substrate to support the RF board 2. A flexible circuit or wiring harness may provide the power and control signals from an external source. The distribution board 4 can also be active or passive depending upon whether or not the distribution board 4 has active components mounted on it. The distribution board 4 can also be any other supporting structure, such as a honeycomb, or aluminum support plate.

The control section 11 of the distribution board 4 may support various electronic components 10 related to control, power, non-RF, or other functions of the system. These electronic components 10 comprise individual devices such as 10a, 10b, and 10c. The electronic components 10 may provide power and control signals to active components on, or in, the RF board 2. With the electronic components 10 of the control section 11 mounted on the distribution board 4, the distribution board 4 is referred to as an active board. In yet another exemplary embodiment (not illustrated), the electronic components 10 are not mounted on the distribution board 4. Instead the distribution board 4, whether rigid or flexible, could be connected to electronic components 10 located off of the distribution board 4 using any type of conventional means, such as a cable harness or a flexible circuit. In such a case, distribution board 4 would be referred to as a passive board. The distribution board 4 can be considered passive in that no active electronic components 10 are mounted on it. Furthermore, the RF board 2 could be used independent of the distribution board 4 depending upon whether, or not, the RF board 2 contains active devices or is otherwise designed to require the support of a distribution board 4.

One or more cavity sections 12 may be provided within RF board 2. Each cavity 13 within the cavity sections 12 may support electronic components to perform a desired signal processing function on the signal propagating through each channel 6. When active electronic components are placed in a cavity 13, the RF board 2 is considered an active board and can be unidirectional or bidirectional depending on the active components used.

The electronic components placed within the cavity 13 may include Monolithic Microwave Integrated Circuits (MMICs). When an MMIC is not enclosed in a package but is placed directly (or using a small carrier) onto the RF board 2, the MMIC component may be referred to as an MMIC die. Other types of active or passive electronic devices could be inserted into the cavity 13, such as diodes, phase shifters, switches, attenuators and circulators, to provide various kinds of processing of the signal in any channel 6. The entire channel 6 can be externally plated with a conductive material. Such plating can provide a highly isolated signal path even with one or more active electronic devices placed within the path. It is understood that terms such as "device," "component" or "module" may be used interchangeably in referring to the active or passive electronic part inserted into the signal path. Examples of other devices that may be embedded within the cavity 13 include multiple input multiple output (MIMO) integrated circuits, micro electro mechanical systems (MEMS) circuit, low noise amplifiers (LNAs), mixers, modulators, or multiple component modules.

Alternatively, the RF board 2 can be constructed without any electronic components inserted into the signal paths of channels 6a, 6b and 6c, thus providing only a power divider and/or combiner function based on the power divider circuit embedded in the component section 8 area of the RF board 2. In such a case, the RF board 2 may function as a power divider for signals entering port 5 and exiting at ports 7a, 7b and 7c. Note that, in this case, RF board 2 may be considered a passive board and would likely be bidirectional.

Power and control signals can interconnect the electronic components 10 with the electronic components placed within the cavities 13 of the RF board 2. For example, if the component within the cavity 13 is a phase shifter, a micro controller or other component 10 in the control section 11 may set control signals that interface to the phase shifter component to adjust the phase. A technique of routing the control and power signals through the distribution board 4 and then connecting them into the cavities 13 within the RF board 2 through holes or apertures may significantly reducing routing complexities. This reduced routing complexity may provide for increased electromagnetic isolation, and improved space and mass requirements of the PCB.

Each cavity section 12 may be enclosed by a cover 14. As illustrated in FIG. 1, the cover 14 may enclose two cavities 13 and a connecting transmission line section 15, which together make up the cavity section 12. The inside of the cavity section 12 may be referred to as a "work area" as it provides a space for components to be placed and interconnected to the traces of the PCB. A cavity section 12 may also include any number of cavities 13 and any number of connecting transmission line sections 15. The cover 14 may be formed of a conductive material and can contain absorbers to suppress undesired waveguide modes and improve isolation. Solder or a conductive epoxy can be used to seal the cover 14 onto the RF board 2. Alternatively, the cover 14 may be secured using a conductive adhesive or other mechanism of attachment. Having the cover 14 bonded down with a conductive epoxy or solder can ensure that an electromagnetic shield, known as a Faraday Cage, may be established around the devices and any connecting transmission line section under the cover 14. Such a shield may ensure that no stray signals radiate out of, or into, the device cavity 13 of the RF board 2.

One exemplary use of the mixed signal board 100 is in the feed network of an antenna to control an antenna beam, and more specifically, as an active feed network for a phase array antenna which could require tens or hundreds of mixed signal boards 100 depending upon the number of antenna elements in the array. An input signal entering one exemplary embodiment of the mixed-signal board 100 can be split out multiple ways by a power divider circuit. Each path split from the power divider can form a signal channel whose signals propagating through branches of the RF board 2 and may be modified by embedded MMIC components that are controlled to feed individual elements of the array antenna.

Another exemplary use of the mixed signal board 100 is an input device for one or more traveling wave tubes (TWT). In such an example, branches of the RF board 2 may be controlled to adjust the phase and amplitude of the input signal to the TWTs.

Still another exemplary use of the mixed signal board 100 could be as a N×M switch with integrated amplifiers. In such an example, N is the number of RF input channels and M is the number of RF output channels.

The RF signals supported by the RF board 2 may be well over 1 GHz. For example the RF board 2 may support 10 GHz, 20 GHz, 30 GHz, 40 GHz, 80 GHz, or 100 GHz. Or, for example, the RF board 2 may support signals with frequency components raging from DC (or zero hertz) up to 100 GHz, or possibly more.

Figure 2:
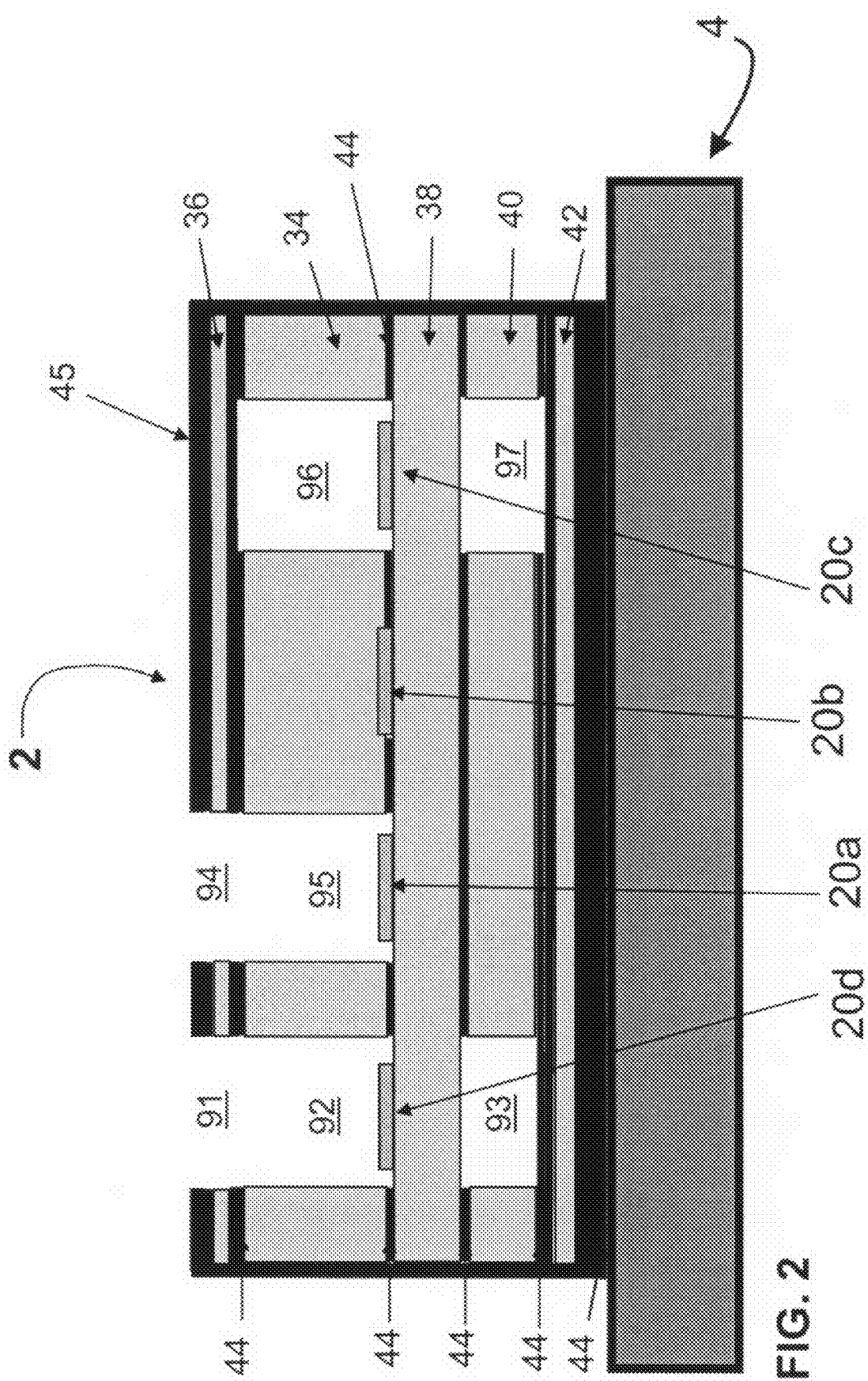
FIG. 2 illustrates a cross section, or end view, of four transmission lines, as well as the layered structure of an RF board according to one exemplary embodiment of the present invention.

Turning now to FIG. 2, the figure illustrates a cross section or end view of four transmission lines as well as the layered structure of the RF board 2 according to one exemplary embodiment of the present invention. The figure highlights the similarities and differences in four transmission medium structures and how any one or any combination of the structures can be constructed in one RF board with all of the center conductors positioned in a coplanar fashion.

Figure 3:
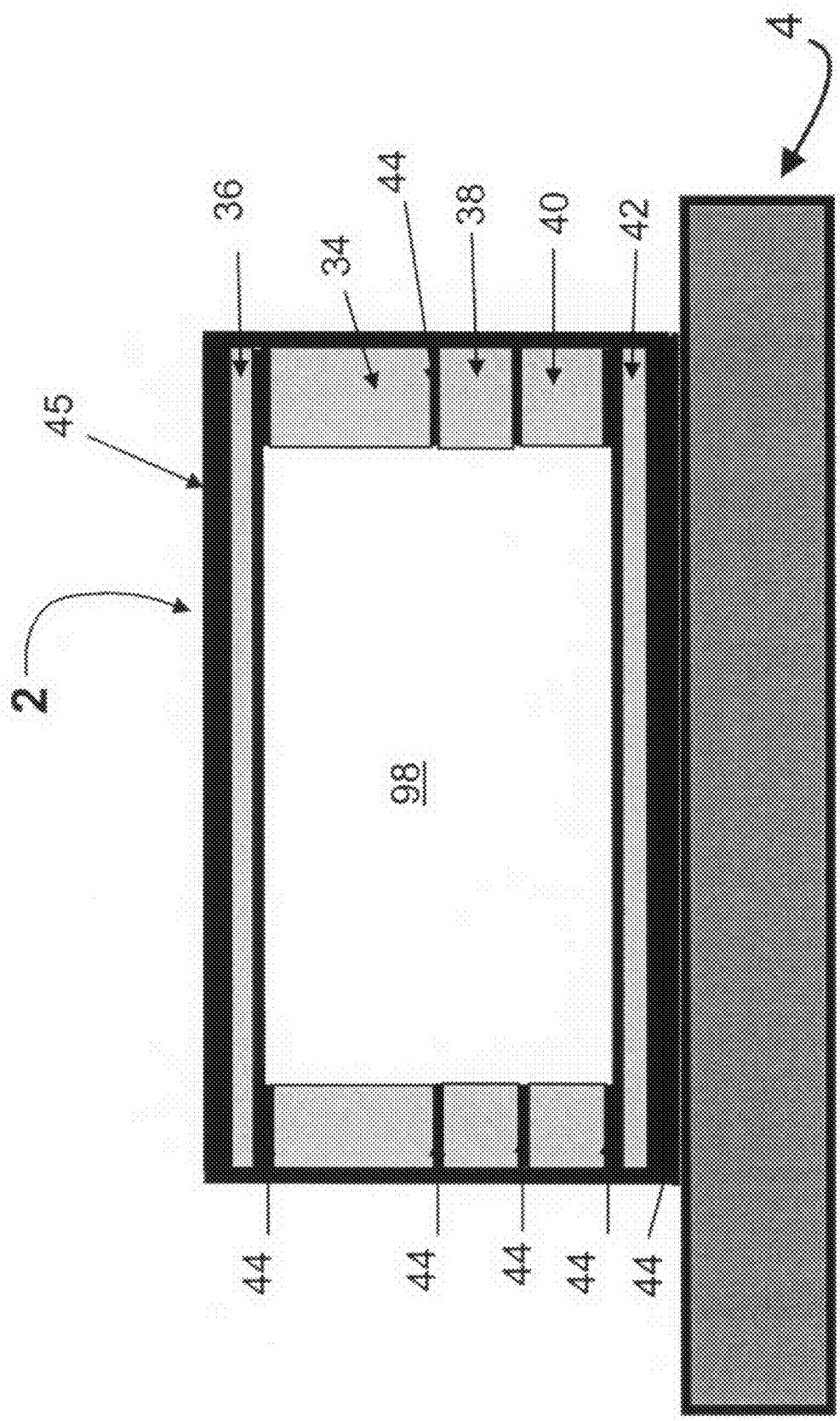
FIG. 3 illustrates a cross section, or edge view, of a waveguide channel formed with dielectric side walls and conductive top and bottom surfaces according to one exemplary embodiment of the present invention.
Figure 4:
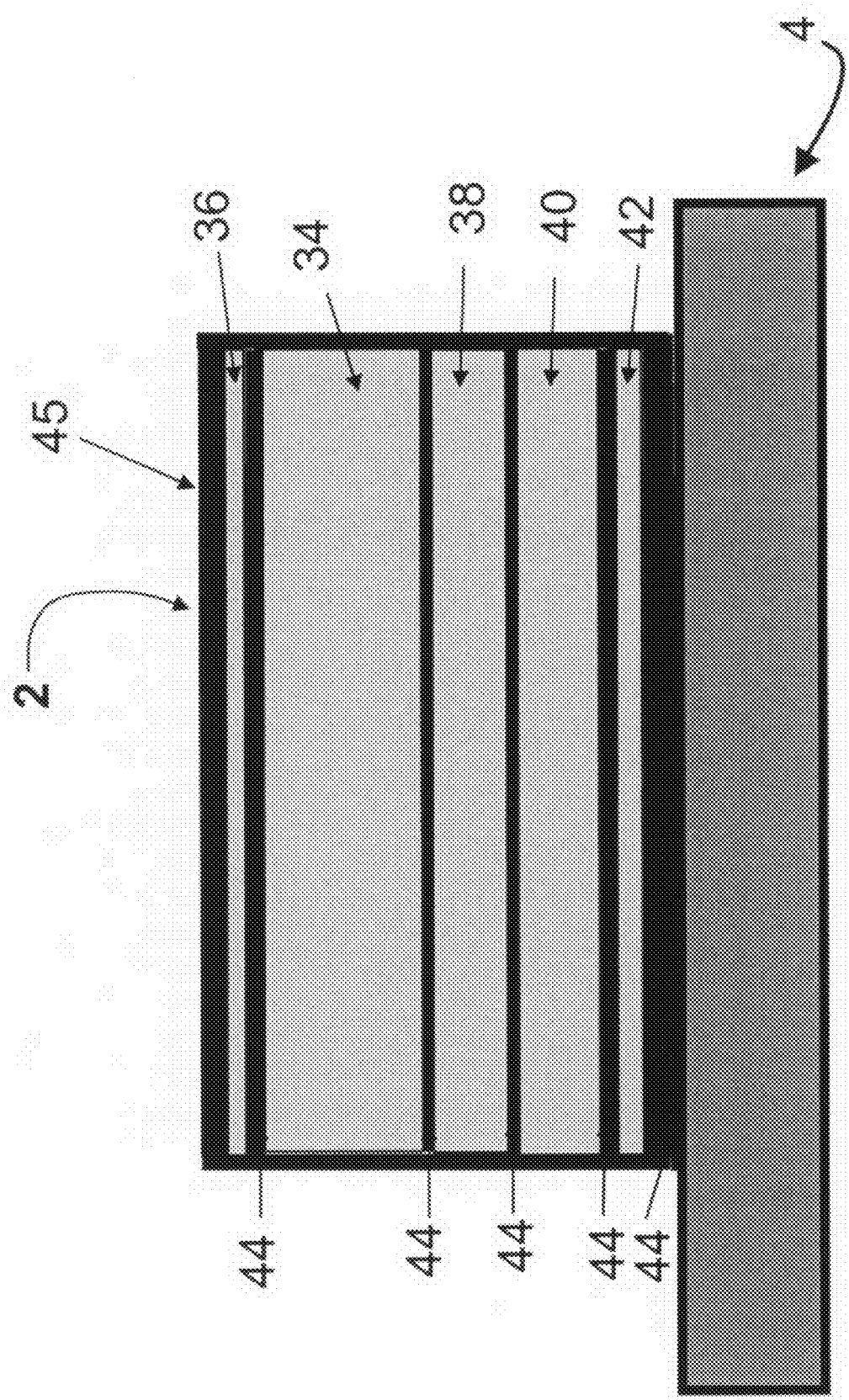
FIG. 4 illustrates a cross section, or edge view, of a waveguide channel with a dielectric core according to one exemplary embodiment of the present invention.

Five PCB layers may be used to construct an RF board 2 and establish four different types of transmission line types. Although four types of transmission paths or transmission mediums are illustrated in one transmission line section, it is understood that the line section could be built with only one type of transmission line, such as a microstrip line, or the line section could be constructed with any number and any combination of the different transmission line types. In addition to the four transmission mediums of FIG. 2, waveguide transmission sections as illustrated in FIGS. 3 and FIG. 4 may also be constructed as fifth and sixth possible transmission mediums within the RF board 2.

The RF board 2 may comprise three dielectric inner layers, 34, 38, and 40. The RF board 2 may further comprise two conductive closeout layers 36, 42. All layers 34, 38, 40, 36, 42 may be adhesively bonded, chemically bonded, or bonded by other conventional means by bonding layers 44.

Once the layers 34, 38, 40, 36, 42 are bonded into a single RF board 2, the entire board may be plated on all sides with a conductive edge plating 45 to form the Faraday Cage or electromagnetic shielding. This shielding may minimize leakage between channels and provide increased isolation between channels. Such isolation may be on the order of 80 dB of isolation or more, for examples.

Thin top and bottom closeout layers 36 and 42 of dielectric may be made of a solid conductive material (such as aluminum or copper), double sided clad PCB material coated on both sides with conductive material), or single sided clad PCB. These closeout layers 36 and 42 form the top and bottom ground planes of the RF board 2. If a single-sided clad PCB is used for layers 36 and 42, the conductive material could be coated on either the inner or outer surfaces of the top and bottom close-out layers.

RF board 2 may be placed on top of, and may be secured to, distribution board 4 by a conductive or non-conductive bonding layer 44. For example, bonding layer 44 may be an adhesive layer. If a conductive bonding layer is used, such as solder or a conductive adhesive, the ground plane of the RF board 2 can be electrically connected to a top conductive surface of the distribution board 4 to form a common ground connection between the RF board 2 and the distribution board 4. As such, the power and control signals of the distribution board 4 may share a common ground plane with the transmission medium paths on the RF board 2. This common ground arrangement can minimize undesired independent electrical loops and aid in maintaining isolation between the various circuit paths, such as channels 6a, 6b, 6c, on the RF board 2.

A thin center layer 38 serves as a support layer for each trace 20a, 20b, 20c, and 20d. Cutouts or voids in sections of the layers 34 and 40 can allow for simple transitions between the different transmission path types. Trace 20a is in a microstrip configuration, having a portion of layer 34 (void 95) and a portion of all the layers above layer 34 (void 94) cut out to create a dielectric void and a ground plane void above the length of the microstrip. Trace 20d is in a suspended microstrip configuration, with a portion of dielectric layer 34 (void 92), a portion of all the layers above layer 34 (void 91), and a portion of dielectric layer 40 (void 93) all cut-out to form dielectric voids above and below stripline trace 20d and a single ground plane below the suspended microstrip trace. Trace 20c is in a suspended stripline configuration, with cutaway sections of dielectric layer 34 (void 96) above, and of dielectric layer 40 (void 97) below, center conductor trace 20c and its thin dielectric support center layer 38. These cut away sections leave dielectric voids both above (void 96) and below (void 97) trace 20c so that it is suspended between two dielectric voids and two ground planes, hence referred to as a suspended stripline transmission media configuration.

Center dielectric layer 38 may be the same thickness or a larger thickness than the other dielectric layers. Also, the center dielectric later 38 may be thinner than the other dielectric layers to act as a trace supporting layer. All dielectric layers may comprise the same dielectric materials, or they may differ in any combinations, or they all may be different from one another. For example, the center dielectric layer 38 may intentionally comprise a harder, or denser, or more rigid, type of RF PCB material in order to support wire-bonding (or other connection or bonding techniques) of the traces supported upon center layer 38.

The traditional stripline formed around center trace 20b is similar to the suspended stripline of trace 20c, except there is no cut-out in any of the PCB layers so that the dielectric both above and below trace 20b is a function of the PCB material, with the trace enclosed with top and bottom ground planes.

Turning now to FIG. 3, the figure illustrates a cross section or edge view of a waveguide channel formed with dielectric side walls and conductive top and bottom surfaces according to one exemplary embodiment of the present invention. The center portions of the three interior dielectric layers 34, 38, and 40 (and their adhesive bonding layers 44) are removed or cut-away to create a dielectric void cavity 98. The thin close-out top layer 36 and the thin close-out bottom layer 42 may remain intact to provide top and bottom waveguide surfaces. The edges of the RF board 2 may be edge-plated 45 with a conductive material to form a waveguide transmission path. The conductive material may be copper, silver, any other metal, or any combination thereof, for example.

Turning now to FIG. 4, the figure illustrates a cross section or edge view of a waveguide channel with a dielectric core according to one exemplary embodiment of the present invention. The three dielectric layers 34, 38, 40, and two conductive closeout layers 36, 42, with their adhesive bonding layers 44 may all be left intact. The layers may be laminated to form RF board 2 and the entire RF board 2 may be clad with conductive material 45.

Both the open waveguide illustrated in FIG. 3 and the dielectric waveguide illustrated in FIG. 4 can be fed RF energy using a trace (not shown) according to conventional waveguide mode launch techniques. In both types of waveguides, the entire RF board 2 may be plated on all sides with a conductive material 45 to form the Faraday Cage as discussed with respect to FIG. 2.

Figure 5:
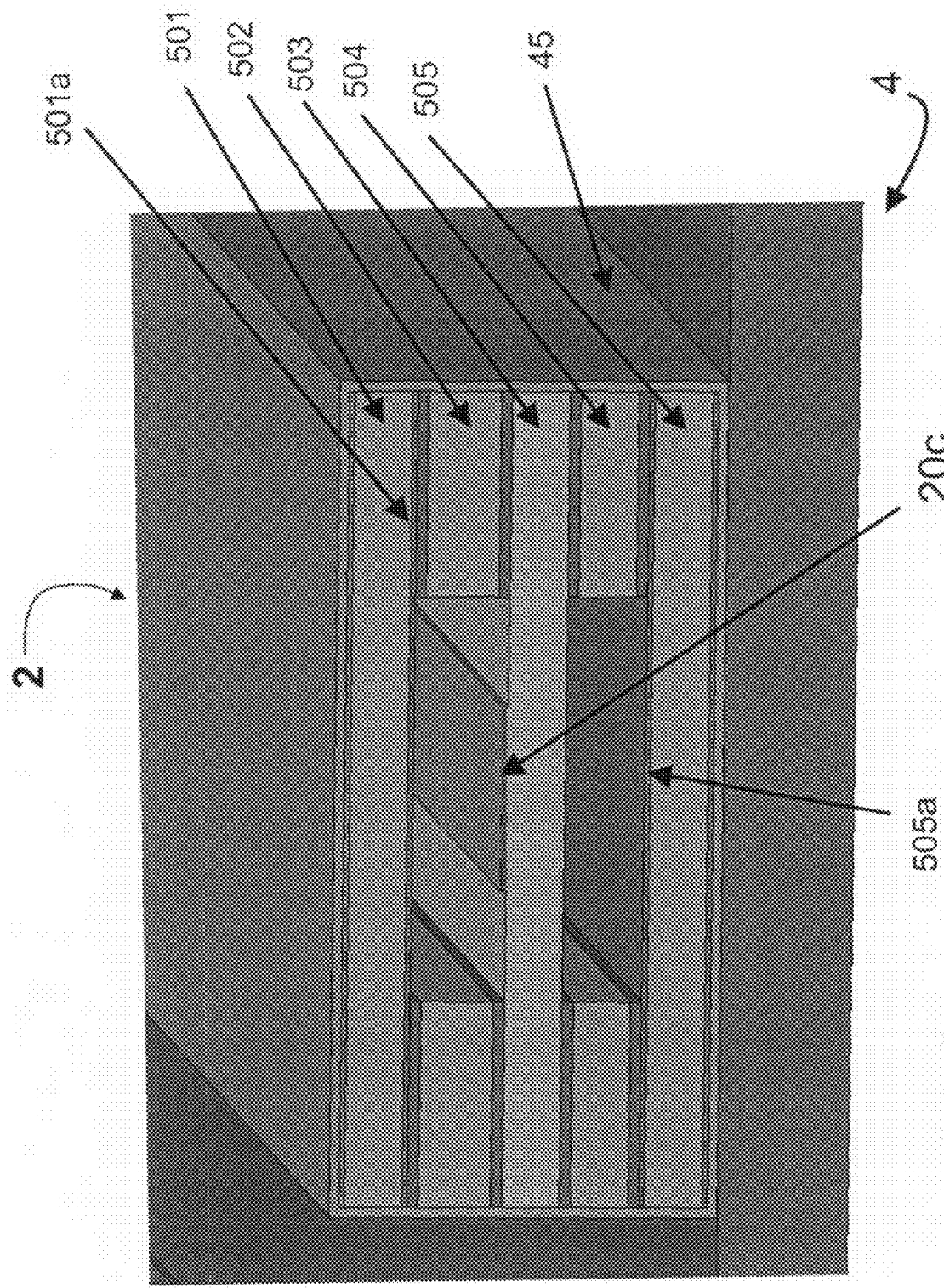
FIG. 5 illustrates a perspective cross-sectional view of a suspended stripline according to one exemplary embodiment of the present invention.

Turning now to FIG. 5, the figure illustrates a perspective cross-sectional view of a suspended stripline according to one exemplary embodiment of the present invention. The cross-sectional view of FIG. 5 is taken along cut-line B-B of transmission line 3 in FIG. 1. A suspended stripline transmission line can have a center conductor 20c, with ground plane 501a above the trace 20c and ground plane 505a below the trace 20c. The suspended stripline can also have dielectric voids between the trace 20c and the ground planes 501a, 505a both above and below the trace 20c. A clad bottom surface 501a of a top close-out layer 501 may serve as the top ground plane, and the clad top surface 505a of bottom close-out layer 505 may serve as the bottom ground plane. Portions of second layer 502 and fourth layer 504 may be cut out to eliminate the dielectric material above and below center layer 503, and to form side walls in the center channel of this suspended stripline section. Layers 502 and 504 thus are spacer layers. The center layer 503 supports or suspends the stripline center conductor 20c in the channel. This configuration forms dielectric voids within the channel around the stripline. The center layer 503 may be thinner than layers 501, 502, 504, and 505. Alternatively, all layers 501-505 may be the same thickness. Alternatively, the sum of the thicknesses of layers 503 and 504 may be substantially equal to the thickness of layer 502 in order to position the trace 20c equidistant from the upper ground plane 501a and the lower ground plane 505a.

Figure 6:
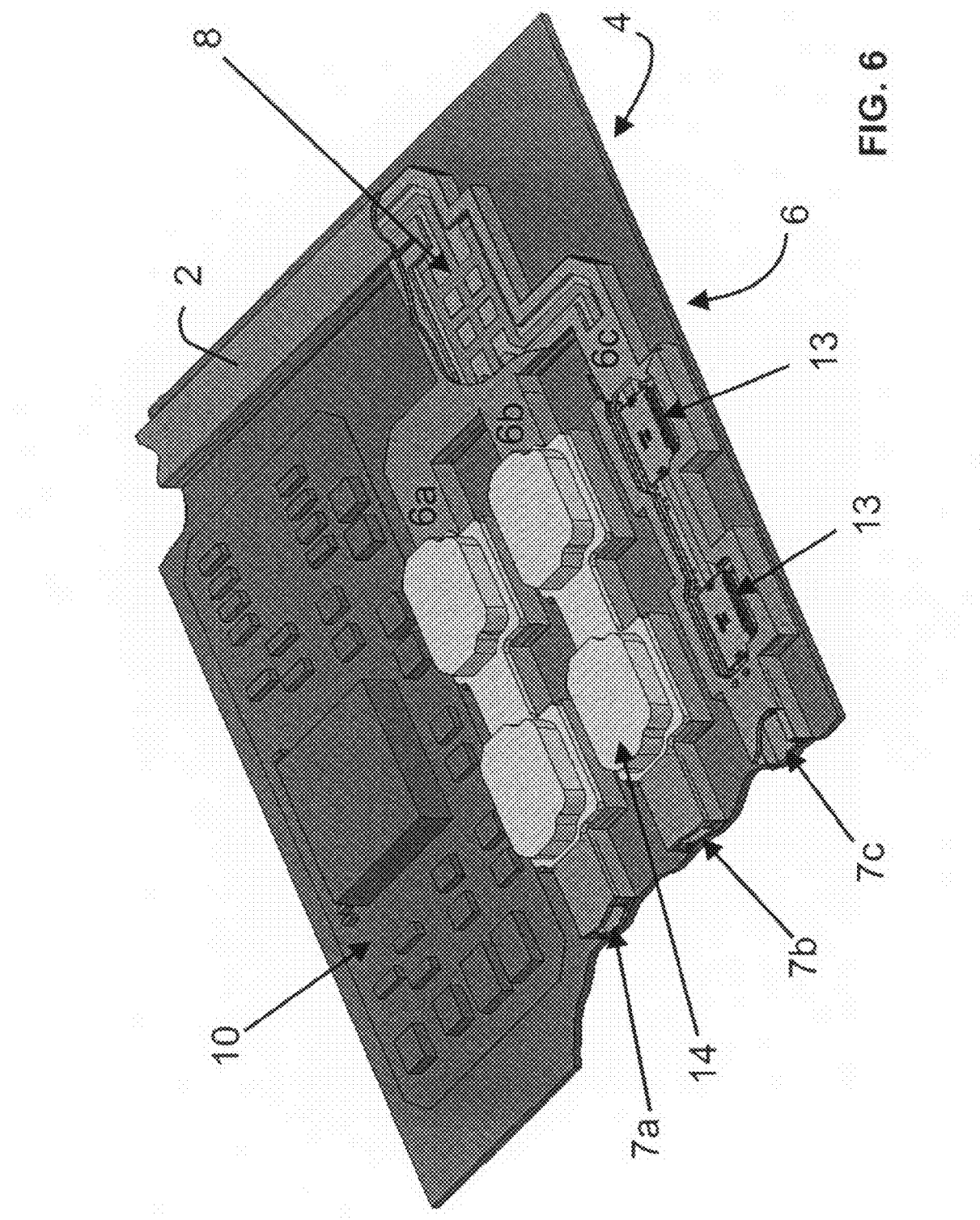
FIG. 6 illustrates a mixed signal board with a cover removed according to one exemplary embodiment of the present invention.

Turning now to FIG. 6, the figure illustrates a mixed signal board 100 with a cover removed according to one exemplary embodiment of the present invention. The figure illustrates another view of the embodiment illustrated in FIG. 1 but with the top layer of section 8 cut away and the cover of channel 6c removed for illustrative purposes.

The conductive traces exposed by the cut away of section 8 may provide a microstrip power divider structure. The cavities 13 within branch 6c of the RF board 2 have their covers 14 removed to reveal low noise amplifier (LNA) MMIC die devices within the cavities 13. The MMIC devices can be inserted in series in the channel 6c. Further details of this mixed signal board 100 are discussed explained with reference to FIGS. 7-11.

Figure 7:
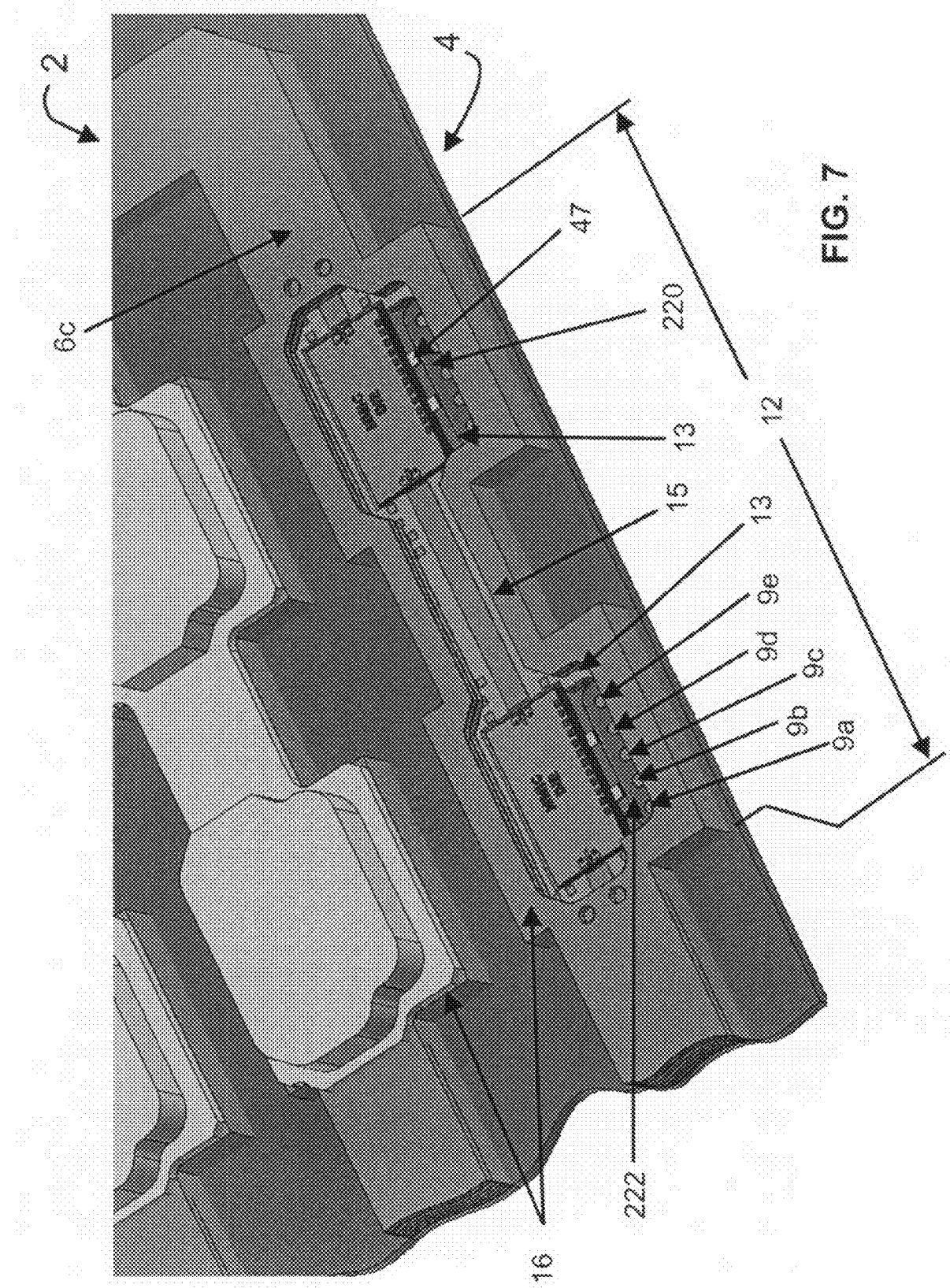
FIG. 7 illustrates a cavity section with the cavity cover removed according to one exemplary embodiment of the present invention.

Turning now to FIG. 7, the figure illustrates a cavity section 12 with the cavity cover 14 removed according to one exemplary embodiment of the present invention. The cavity section 12 can be defined as a region cut out from a normally enclosed and sealed transmission line channel formed on the RF board 2. After a circuit component has been placed into the cavity 13 and the device has been connected into the transmission path, the cavity 13 may be enclosed with a cover 14 and sealed just as in the other channels. The cavity section 12 may have sub-sections that go down to different depths. In the microstrip connecting transmission line section 15, the cavity can go down to just the layer of the RF board 2 that supports the microstrip line. This connecting microstrip line section 15 can either have a suspended stripline or a traditional stripline section may be used between the two MMIC dies to create a debris blocker. In this section 15, the debris blocker is not as critical because any debris that happens to fall into this short line segment can be easily removed due to the cavity's open work areas at both ends of the line segment.

A cavity 13, or work area 13, in which an active electronic device is placed, may contain a pocket 44 for supporting the device and an access hole 220, 222 for connecting signals to the device. The pockets 44 are not visible in FIG. 7 because MMIC dies are inserted into each pocket. The pocket 44 and access hole 220, 222 can be formed with different depths, or to different layers, of the RF board 2. For example, the bottom surface of pocket 44 may be the bottom ground plane layer of the RF board 2. The pocket can be sized and shaped to accommodate a particular active electronic device to be used with the RF board 2.

Wire bond pads 9 (also referred to as leveled vias) may be formed on the top surface of the distribution board 4 and are visible through access holes 220, 222. The access holes 220, 222 may be made in the form of slots cut out of the work area 13 so that the wire bond pads 9a-9e are exposed into the cavity 13. These pads 9a-9e can contain power and control signals brought up from predetermined layers of the distribution board 4 beneath its top surface. Bonds wires may typically be one one-thousandths of an inch in diameter. These wires can connect PCB pad 9 to a connection point on the MMIC die device.

The power and control signal access hole 220, 222 may be provided in the bottom of the RF board 2. Instead of it being a single aperture in the shape of a slot encircling a row of power and control signal pads 9, the access hole 220, 222 can be made as a series of small circular openings that expose just a single pad 9 in each opening 220, 222. Drilling each opening 220, 222 through the bottom ground plane of the RF board 2 to form a separate aperture for each pad 9 instead of having all pads appear within one slot cutout may reduce noise or improve isolation. The separate holes may individually act as a filter to prevent RF energy from radiating through any one of the apertures, each of which is much smaller of course than one oval or rounded-rectangular shaped slot for encompassing all of the pads 9. An electrical fence, of sorts, can be built for improved signal isolation by forming access holes 220, 222 that separately surround each pad.

As an alternative to the use of access holes surrounding the power and control signal pads, as described, conventional via pins may be used to connect the power and control signals to the active electronic device on the RF board 2. Electrically isolated via pins can be inserted through the bottom ground plane layer of the RF board 2 for connecting power and control signals from an independent distribution board 4. A disadvantage of such an approach may be complication to the otherwise concurrent construction of the two boards 2, 4.

Circuit lines can be run through the distribution board 4 to connect power and control signals from the electronic components 10 to pads at a different top surface area on the distribution board 4. Apertures can be made in the RF board 2 as access holes 220, 222 around these control and power signal pads 9. These pads 9 can be wire bonded over a very short distance to active electronic devices within the RF board 2.

The pads 9a-9e provided on distribution board 4 may be formed as small round pads. These pads 9 can supply power and control for connection to the MMIC die, or other device, by wire-bond wires. Even though they are visible looking down into the cavity 13 formed in the RF board 2, they are not on the RF board 2. Instead, the pads 9 may be formed on the top surface of the underlying distribution board 4. Access holes 220, 222 in which the pads 9 appear can be machined completely through the RF board 2. The RF board 2 can then placed on top of the distribution board 4 so that the access holes or open slots 220, 222 allow access to the five pads 9a-9e on the top surface of the distribution board 4.

The pads 9 on distribution board 4 may use vias to transport the signal through layers of the distribution board 4. Generally, a PCB via is a hole drilled in the PCB that is plated through (typically with copper) to tie an underlying circuit to a top surface pad. To keep the board size small, and specifically the size of the access hole small, the vias may be filled with a conductive medium and then leveled, forming a configuration referred to as a leveled via pad. Gold plating (or other suitable material) may be added to the top of the leveled via. This plating is thick enough that a wire bond can be made to the leveled via. The resulting row of pads 9a-9e may be only about one to two one-thousands of an inch above the top surface of distribution board 4.

As an alternative to the leveled via pad, a PCB via can be used with a trace that runs to another pad that is used for wire bonding. This technique may require additional board space and larger access holes 220, 220 than the leveled via approach.

Figure 8:
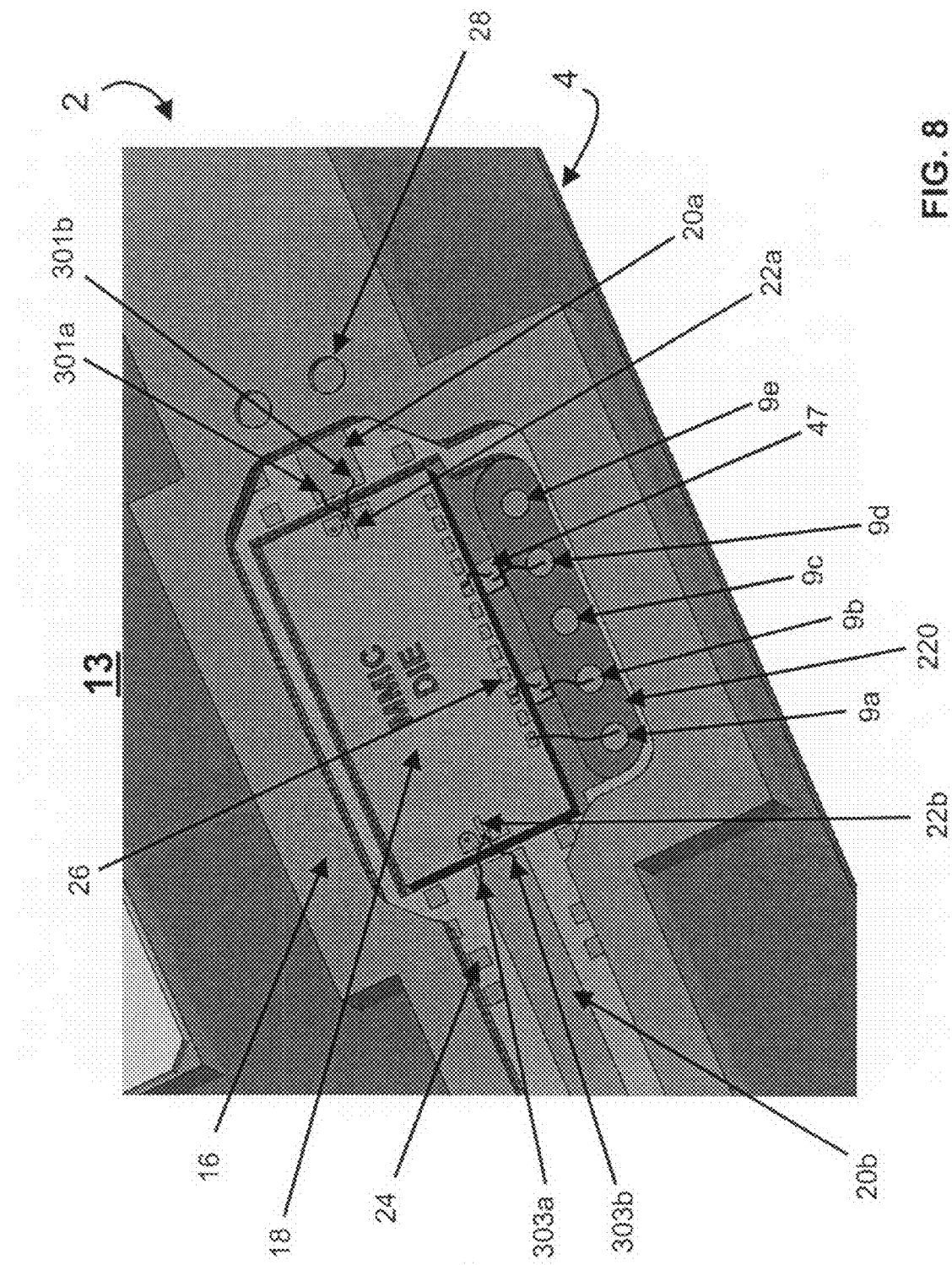
FIG. 8 illustrates a portion of an RF board with an embedded MMIC die according to one exemplary embodiment of the present invention.

Turning now to FIG. 8, the figure illustrates a portion of an RF board 2 with an embedded MMIC die 18 according to one exemplary embodiment of the present invention. Microstrip traces 20a, 20b can lead into and out of the MMIC die 18 and are parts of a RF transmission path. Terminals 22a and 22b on either end of the MMIC die 18 can be are wire-bonded to traces 20a and 20b using bonding wires 301a, 301b and 303a, 303b. RF tuning pads 24 can be located on either side of traces 20a and 20b. Wire-bond connection points 26 located on the top surface of the MMIC die 18 may be wire-bonded to pads 9a-9e. The MMIC die 18 can rest on any one of the dielectric layers of RF board 2 depending on the thickness of the die circuit 18 which will affect the depth of the pocket 44. The MMIC die 18 can rests on the bottom ground plane layer of RF board 2 so that the device terminals 22a and 22b are co-planar with traces 20a and 20b to allow simple connections along the same plane. Cutouts in the top and bottom layers of the RF board 2 may be made to expose an internal cavity 13. Suppression vias 28 in the top layer 501 and in bottom layer 505 (not illustrated) can be positioned near the edge of the cavity 13 to prevent RF energy from entering and propagating between the clad surfaces of layers 501 and 505. Access holes or apertures 220 may be made through the entire RF board to allow for connection of power and control signals from the distribution board 4 to the MMIC die 18.

RF bypass capacitors 47 may be positioned immediately adjacent to the MMIC die 18 to provide decoupling between the control/power signal input pads 9 and the die 18 as well as to provide filtering for the electronic device. Wire bonds between the wire-bond connection points 26 on the MMIC die 18 and the bypass capacitors 47, and between the bypass capacitors 47 and the wire-bond pads 9, complete the desired circuit. The bypass capacitor 47 can be electrically connected to the bottom ground plane of the RF board 2 using solder or a conductive adhesive. Bypass capacitor 47 performance is improved through the ability to locate the bypass capacitor 47 in very close proximity to the MMIC die 18.

The MMIC die 18 may be electrically connected to the ground plane of the RF board 2. The ground planes of the RF board 2 and the distribution board 4 may or may not be electrically connected, depending on the design. If the two ground planes are connected, the RF board 2 and the distribution board 4 can be said to share a common ground.

Figure 9:
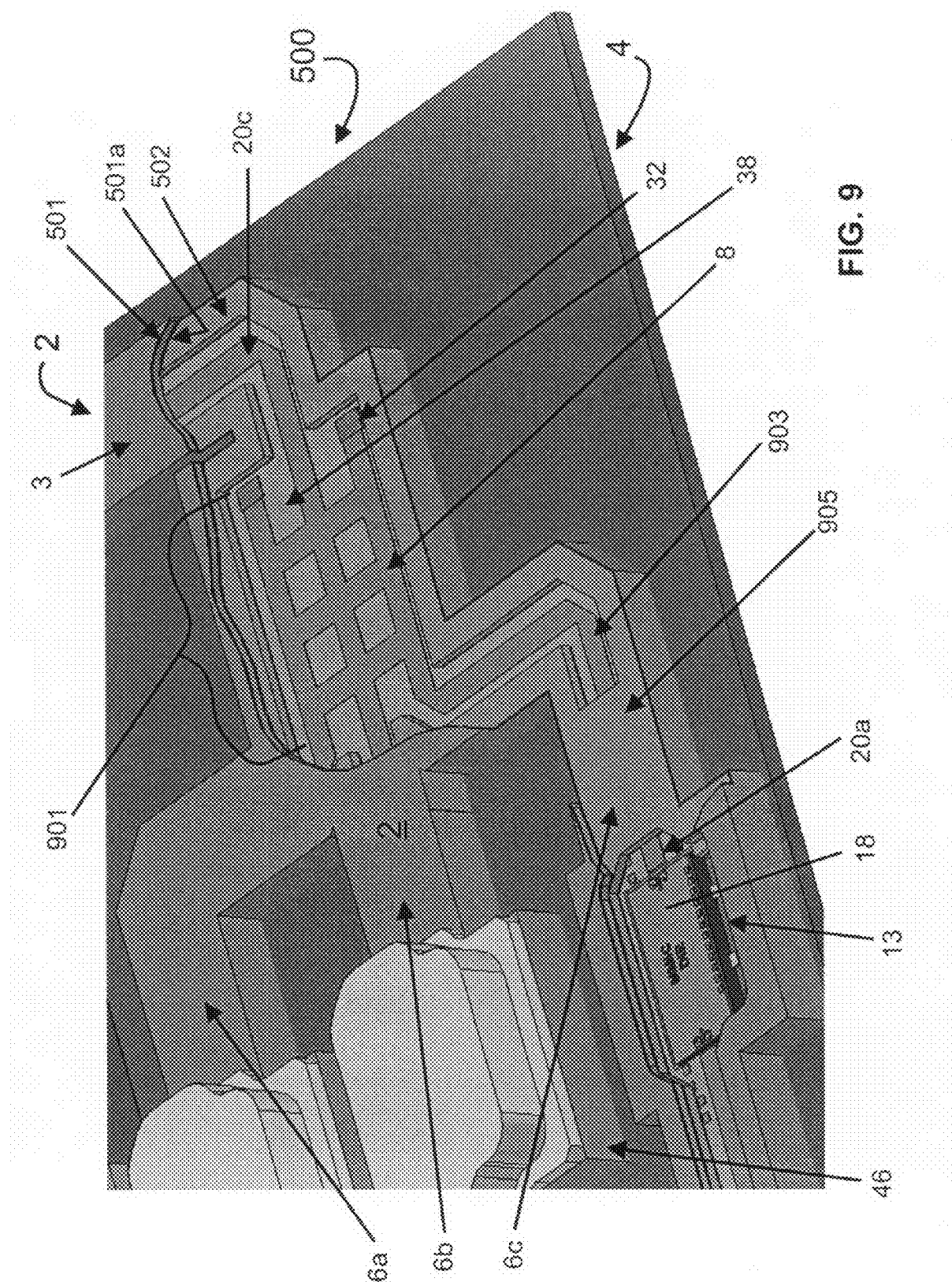
FIG. 9 illustrates an RF board with a cut-away component section and an uncovered cavity according to one exemplary embodiment of the present invention.

Turning now to FIG. 9, the figure illustrates an RF board 2 with a cut-away component section 8 and an uncovered cavity 13 according to one exemplary embodiment of the present invention. The figure illustrates how one common trace can transition into different transmission line types through the RF board 2 as well as support active electronic devices embedded into the signal paths. Component section 8 of RF board 2 can support a one-to-three suspended stripline power divider 901. Other circuits or discrete components can also be supported such as a terminating resistor 32. The power divider circuit 901 may be integrated into and extends from trace 20c of line section 3. The power divider 901 may also be integrated with and extend into the suspended stripline traces that extend into channels 6a, 6b, 6c from the three outputs of the power divider 901. One output branch from power divider 901 can supply trace 903 in the form of a suspended stripline that extends into channel 6c.

As the input trace 20c feeds into a power divider 901 where the input signal is split up or divided, it is understood that additional power dividers may be used in sequence to obtain further power divisions. Various other types of RF circuits or signal couplers could also be used. While a branch-line coupler and power divider is illustrated, other techniques could be used. For example, a Wilkinson or a rat race power divider may be used.

Trace 903 can transition from a suspended stripline trace to a traditional stripline (not visible) where a dielectric material can fill the area on both sides of the microstrip. This transition to tradition stripline may occur where the transmission line passes under the top dielectric layer 905 of channel 6c. This structure can form a debris blocker close to the open cavity 13 to prevent debris from entering the suspended stripline section of trace 903 from the work area 13. Where trace 903 exits the dielectric layer 905 at the area of trace 20a, the transmission medium transitions to a microstrip line, with one ground plane below and a dielectric void above the microstrip. Such a microstrip may simplify wire-bonding of the signal to the active device 18.

A vent hole (not shown) through the top layer 501 may be used throughout the RF board 2 where dielectric voids exist. Such vents may help to equalize the internal atmospheric pressure within the voids with the external atmospheric pressure conditions. The vent hole can also be located through the side walls of the RF board 2 or through the bottom layer 505 and extending through the distribution board 4.

The cut-away top portion 500 in the top layer 501 is seen to extend over the center suspended stripline trace 20c and the parallel side sections on either side of the microstrip trace. The second spacer layer 502 may be cut out to form side walls of the dielectric channel that contains suspended stripline trace 20c, while the top layer may form the upper wall of that channel. Thus, line section 3 of RF board 2 has dielectric material removed to form a channel in the line section that contains a suspended stripline transmission path formed of a suspended stripline trace 20c supported on support layer 38 with a dielectric void above and below. Note that the void area below layer 38 is not visible. The upper void is closed out with a top layer 501 clad on its bottom surface 501a to form the top ground plane. While not visible, a similar bottom conductive clad layer serves as the bottom ground plane. While top layer 501 is shown as being a separate layer of PCB, it alternatively could be formed as an integral part of layer 502 with appropriate cut-outs made to form the internal channel of line section 3.

Figure 10:
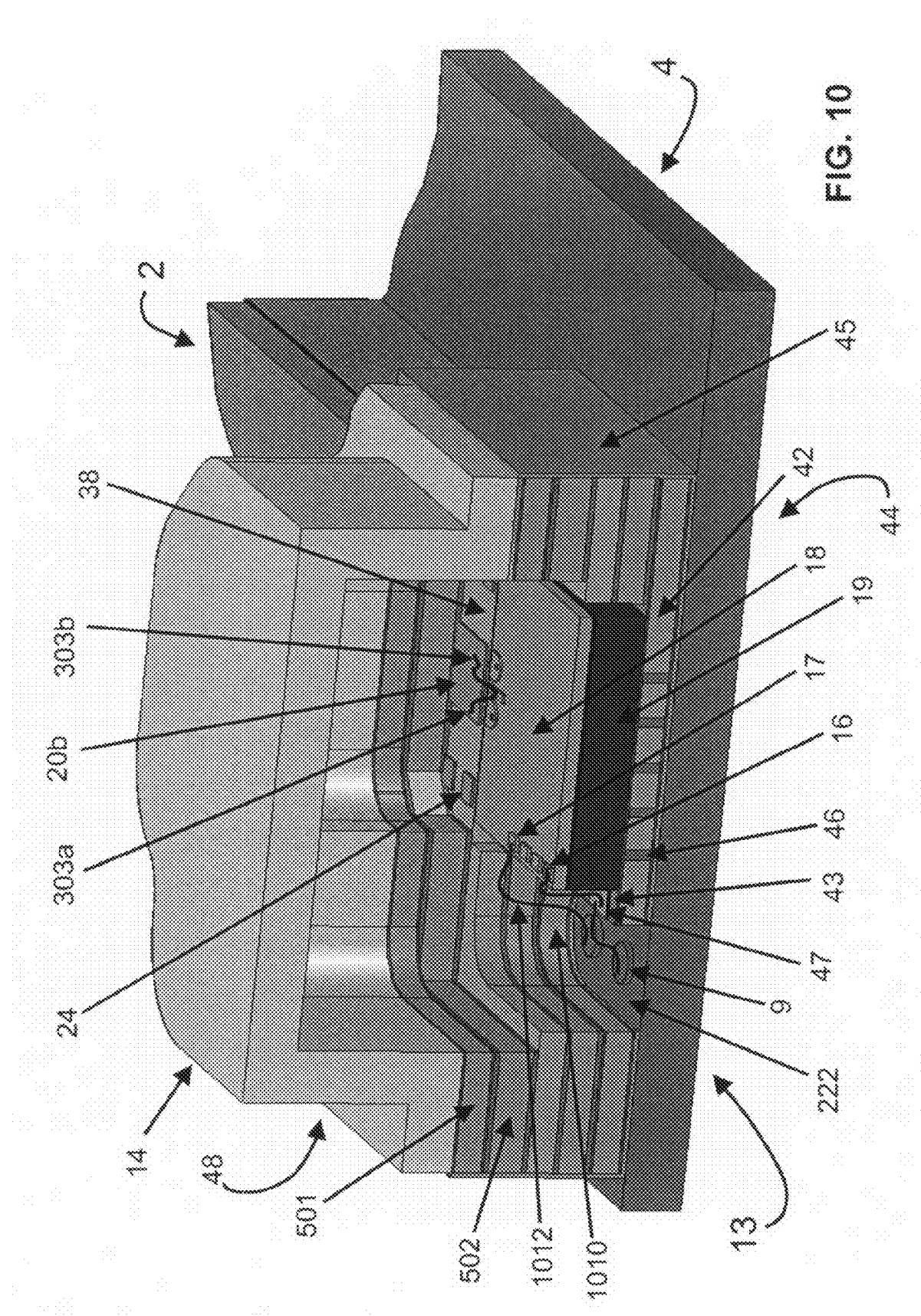
FIG. 10 illustrates a cross-sectional view through a cavity in an RF board containing an MMIC die device according to one exemplary embodiment of the present invention.

Turning now to FIG. 10, the figure illustrates a cross-sectional view through a cavity 13 in an RF board 2 containing an MMIC die device 18 according to one exemplary embodiment of the present invention. The cross-section illustrated in FIG. 10 is taken along cut-line C-C of FIG. 1 and gives an inside view of the layered construction of a cavity 13. Circuit pads 9 on the top surface of distribution board 4 can deliver power and control signals through wire bonds 1010, 1012 to terminals 16, 17 on an MMIC dir 18. The MMIC dir 18 is placed in a pocket section 44 of the work area 13. The depth of the pocket 44 can be based on the thickness of the MMIC die 18. For example, the pocket 44 may be formed to allow the die carrier 19 and the MMIC die 18 to rise from the bottom closeout layer 42 to be coplanar with the microstrip support layer 38. This positioning of the MMIC die 18 can provide for the shortest possible length of wire bond between microstrip trace 20b to the MMIC die 18. The electronic device 18 can be placed on top of an electronic device carrier 19 to adjust the height of the device 18 such that the top of the electronic device 18 is coplanar with the top surface of layer 38. Tuning stubs 24 off to the side of microstrip trace 20b on layer 38, and optionally wire-bonds (not shown) between the stubs and the microstrip trace 20b, can be used to tune out any VSWR mismatch resulting from the wire-bond connection between the MMIC die 18 and the microstrip trace 20b. The bottom of the MMIC die 18 may rests on the top surface 43 of bottom closeout layer 42 which is clad with a conductive material such as copper to form the bottom ground plane. The MMIC die 18 can be soldered or secured with a conductive adhesive layer to this bottom ground plane 43. Thermal vias 46 may be provided in the bottom layer 42. These vias 46 make a thermal connection between the bottom ground plane 43 and the external conductive plating 45 on the bottom of the RF board 2. These vias 46 may be used to dissipate heat from the MMIC die 18 to the external plating 45 and distribution board 4. An aperture or access hole 222 may be cut through all layers of the RF board 2 to form an opening in a bottom region of work area 13. The aperture 222 may fits around the pads 9 on the top surface of distribution board 4. The aperture 222 can be formed as a slot 222 to surround a row of multiple pads 9, or as a series of round holes, each hole aligned around a single pad 9.

The final closed cavity formed by the recess 13 and the cavity 48 can also be modified in size and shape to provide RF performance enhancements. Reduction in undesirable RF modes produced in the final closed cavity can be accomplished by reducing the size of the cover cavity 48 in the region directly above the aperture 222 such that the cover cavity 48 within cover 14 is reduced in width. In addition, cover 14 can be produced with electrically conductive isolation walls fitting between the pads 9 such that electrical shorting between the isolation walls and the pad 9 or bond wires does not occur. An electrical connection between the mating faces of the isolation walls and the top conductive ground plane of the distribution board 4 can be formed using conductive gaskets, conductive adhesives or solder between the mating surfaces. Furthermore, the isolation walls can be used in the region around the RF traces when additional isolation is needed between multiple RF traces. An electrical connection between the mating faces of the isolation walls and the conductive grounding trace on the top surface of layer 38 can be made through a mechanical compression force between the surfaces, the use of conductive gaskets, conductive adhesives, or solder between the mating surfaces.

Figure 11:
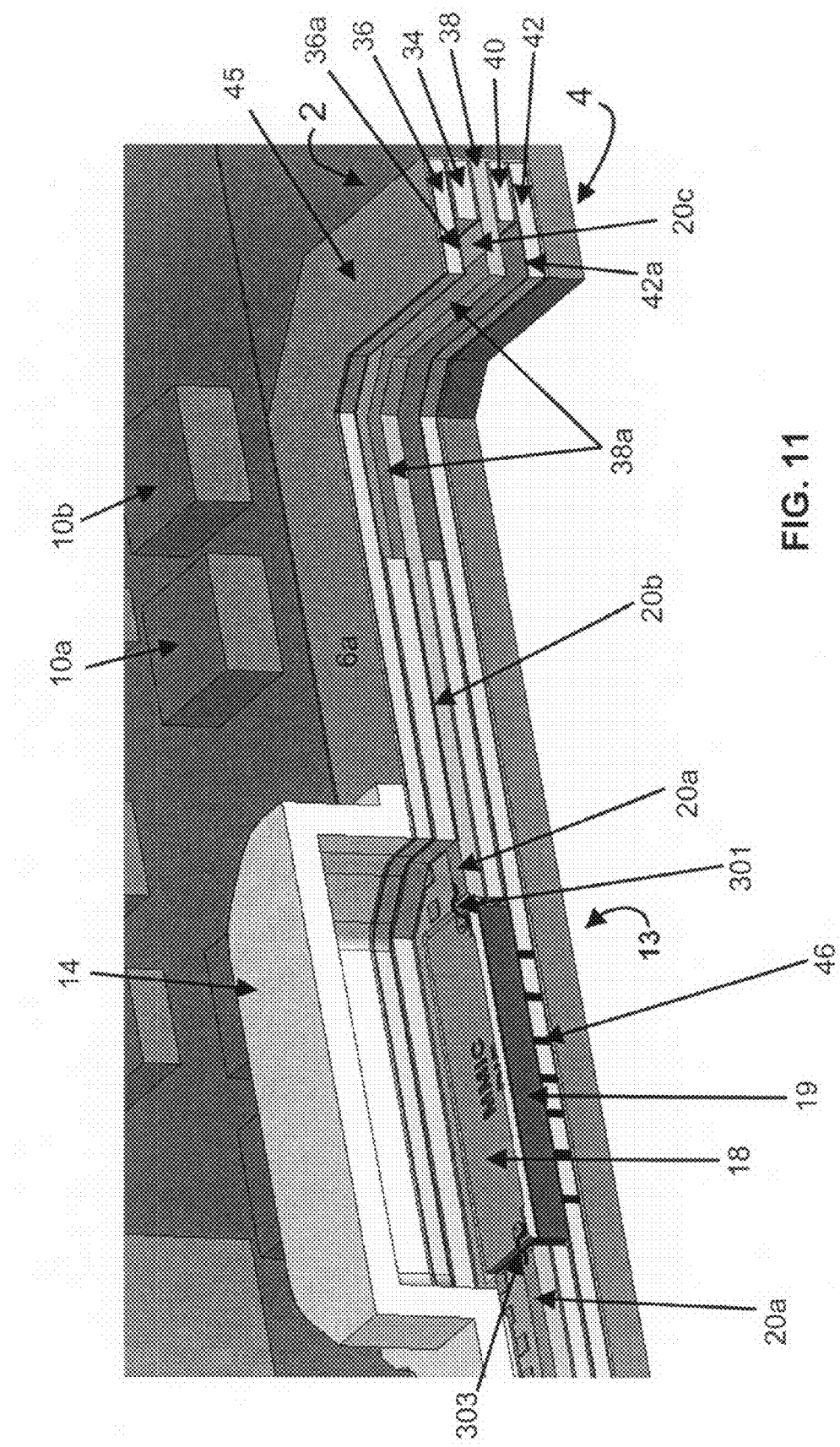
FIG. 11 illustrates a cross-sectional view taken along a transmission path of an RF board according to one exemplary embodiments of the present invention.

Turning now to FIG. 11, the figure illustrates a cross-sectional view taken along a transmission path 6a of an RF board 2 according to one exemplary embodiments of the present invention. The cross-section is taken along the cut-line A-A of FIG. 1 to illustrate the layered construction of the RF board 2 and an active electronic device placed within channel 6a. The RF board 2 can be attached to a distribution board 4. The distribution board 4 can also support electronic modules 10a, 10b for supplying power and control signals to the active electronic device 18 within channel 6a.

Transmission path 6a may be made of five PCB layers. The PCB layers may be referred to as top close-out layer 36, bottom close-out layer 42, center support layer 38 and spacer layers 34, 40. The bottom surface 36a of the top layer 36, and top surface 42a of the bottom layer 42 may be clad with a conductive material to form ground planes. The spacer layers may be cut out to form dielectric voids above and below trace 20c, thereby providing a suspended stripline transmission path. Trace 20c may be formed on the top surface 38a of support layer 38.

Between the right-angle bend in the transmission path and the cavity 13, the transmission path transitions to a traditional stripline structure. That is, the two spacer layers are not being cut out to voids but instead extend over the trace. This forms a blockage to prevent debris from getting into the suspended stripline from the work area 13.

Within the cavity 13, the transmission medium changes to microstrip trace 20a for ease of wire-bonding. The wire-bonding can interconnect trace 20a to a terminal on the active electronic device 18 via bonding wire 301. A similar wire bond connection may be made at the other end of the device 18 to microstrip trace 20a via bonding wire 303.

The active device 18 can rest on the ground plane 42a of the bottom close-out layer 42. Thermal or heat-sinking vias 46 may be provided through the bottom layer 42 to provide heat transfer paths between the MMIC die 18 (or the MMIC die carrier 19) and the external conductive plating 45 applied around the entire channel 6a and the entire RF board 2. The cover 14 may be attached over work area 13 and the entire cavity section.

Figure 12:
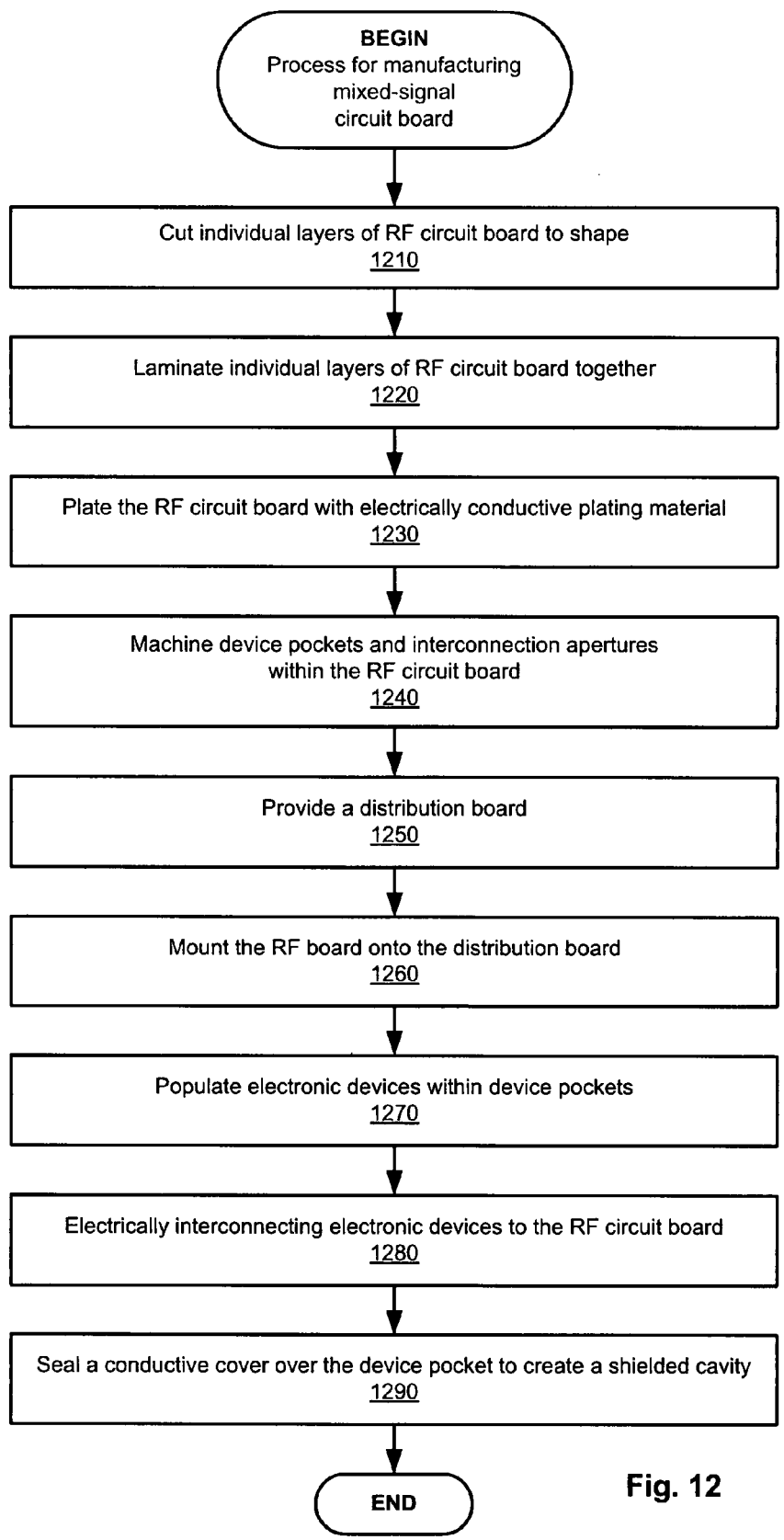
FIG. 12 shows a logical flow diagram representing a process for manufacturing a planar mixed-signal board according to one exemplary embodiment of the present invention.

Turning now to FIG. 12, the figure shows a logical flow diagram representing a process 1200 for manufacturing a planar mixed-signal board according to one exemplary embodiment of the present invention. Certain steps in the processes or process flow described in all of the logic flow diagrams referred to below must naturally precede others for the exemplary embodiment to function as described. However, the invention is not limited to the order of the steps described if such order or sequence does not alter the functionality of the invention. That is, it is recognized that some steps may be performed before, after, or in parallel with other steps without departing from the scope or spirit of the invention.

Referring to FIGS. 1 and 12, the process 1200 is initiated in Step 1210, where the RF signal paths can be designed and individual layers of RF circuit board are cut to shape. In designing each RF signal path, there are at least six transmission types to choose from depending upon the performance requirements of the given portion of the signal path. Six basic transmission mediums for microwave RF signals can be used advantageously for different purposes with the RF board 2. The six transmission mediums can be: voided waveguide, dielectric waveguide, microstrip, suspended microstrip, traditional stripline, and suspended stripline. The individual layers of the RF circuit board may be cut to form the RF signal paths. This cutting can be mechanical cutting, abrasive liquid cutting, laser cutting, chemical cutting, or otherwise.

In Step 1220, the individual layers of RF circuit board can be laminated together to form the RF board. The individual layers can be laminated together using conductive or non-conductive bonding layers 44 such as adhesive layers.

In Step 1230, the RF board 2 can be completely encapsulated with an electrically conductive plating material 45. Such plating of the vertical walls throughout the RF board 2 can provide superior channel-to-channel isolation. For example, up to 70-80 dB of isolation can be achieved by this plating approach.

In Step 1240, cavities 13, device pockets 44, as well as interconnection apertures 222 may be machined, or otherwise cut, into the RF board 2.

In Step 1250, a distribution board 4 may be provided. The distribution board 4 may be a PCB or just a mechanical support board. The distribution board may also be a flexible substrate or there may be no distribution board 4 in use for some applications. The distribution board 4 may be fabricated in a separate PCB process from the fabrication of the RF board 2.

In Step 1260, the RF board 2 may be mounted onto the distribution board 4. Power and control signal pads provided by the distribution board 4 can be aligned through the apertures 222 provided within the RF board 2 in Step 1240.

In Step 1270, electronic devices 18 may be placed within device pockets 44 in the cavities 13 provided within the RF board 2. The electronic devices 18 may include: MMIC dies, diodes, phase shifters, switches, attenuators, circulators, multiple input multiple output (MIMO) integrated circuits, micro electro mechanical systems (MEMS) circuit, low noise amplifiers (LNAs), mixers, modulators, or multiple component modules, for examples.

In Step 1280, the electronic devices 18 populated into the cavities 13 in Step 1270 can be electrically interconnected to the traces within the RF board 2 and the pads 9 of the distribution board 4. These connections can be made by wire-bond techniques, soldering, or other interconnection mechanism.

In Step 1290, cavity covers 14 may be attached over the cavities 13 formed within the RF board 2. The covers 14 may be attached using conductive epoxy or solder to produce a Faraday Cage electronic enclosure for optimum isolation. Process 1200 may end after Step 1290.

From the foregoing, it will be appreciated that the disclosed embodiments of the present invention overcome the limitations of the prior art. Those skilled in the art will appreciate that the present invention is not limited to any specifically discussed application and that the embodiments described herein are illustrative and not restrictive. From the description of the exemplary embodiments, equivalents of the elements shown therein will suggest themselves to those skilled in the art, and ways of constructing other embodiments of the present invention will suggest themselves to practitioners of the art. Therefore, the scope of the present invention is to be limited only by the claims that follow.

What is claimed is:

1. A mixed signal circuit board comprising:
    a distribution circuit board;
    an RF circuit board disposed upon the distribution circuit board and comprising one or more RF signal paths, wherein the RF circuit board is formed around each RF signal path to provide vertical surfaces adjacent to each RF signal path and along a substantial length of each RF signal path; and
    a conductive plating substantially surrounding the one or more RF signal paths including the vertical surfaces.

2. The circuit board of claim 1, wherein each RF signal path comprises a first transmission line and a second transmission line, wherein the first transmission line is a suspended stripline conductor, and the second transmission line is a microstrip conductor coplanar with the first transmission line.

3. The circuit board of claim 1, wherein each RF signal path comprises a first transmission line and a second transmission line, wherein the first transmission line is a stripline conductor, and the second transmission line is a suspended microstrip conductor coplanar with the first transmission line.

4. The circuit board of claim 1, wherein each RF signal path comprises a first transmission line and a second transmission line, wherein the first transmission line is a suspended stripline conductor, and the second transmission line is a suspended microstrip conductor coplanar with the first transmission line.

5. The circuit board of claim 1, wherein the each RF signal path comprises a first transmission line and a second transmission line, wherein the first transmission line is a suspended stripline conductor, and the second transmission line is a waveguide conductor coplanar with the first transmission line.

6. The circuit board of claim 1, wherein each RF signal path comprises a first transmission line and a second transmission line, wherein the first transmission line is a waveguide conductor, and the second transmission line is a microstrip conductor coplanar with the first transmission line.

7. The circuit board of claim 1, wherein each RF signal path comprises a first transmission line and a second transmission line, wherein the first transmission line and the second transmission line are independently one of a voided waveguide, a dielectric waveguide, a microstrip, a suspended microstrip, a traditional stripline, and a suspended stripline; and the first transmission line is coplanar with the second transmission line.

8. The circuit board of claim 1 further comprising a control signal path and a power signal path for electrically conducting a control signal and a power signal through the distribution circuit board to the RF circuit board.

9. The circuit board of claim 1 further comprising a leveled via pad on the distribution circuit board for electrical interconnection with the RF circuit board.

10. The circuit board of claim 1, further comprising an aperture disposed within a bottom surface of the RF circuit board, wherein an electrical signal is connected from the distribution board to the RF board through the aperture.

11. The circuit board of claim 1, further comprising:
    a cavity disposed within the RF circuit board;
    an electronic device disposed within the cavity and in electrical communication with the RF circuit board; and
    a conductive cap affixed to the RF circuit board and operable to cover the cavity.

12. An RF circuit board comprising:
at least one RF signal path, each comprising an RF transmission line;
a plurality of layers of RF circuit board substrate shaped to support the transmission line and an area adjacent to the transmission line; and
a conductive plating substantially surrounding each RF signal path.

13. The circuit board of claim 12, wherein each RF signal path comprises a first transmission line and a second transmission line, wherein the first transmission line and the second transmission line are independently one of a voided waveguide, a dielectric waveguide, a microstrip, a suspended microstrip, a traditional stripline, and a suspended stripline; and the first transmission line is coplanar with the second transmission line.

14. The circuit board of claim 12 further comprising an aperture disposed within a bottom surface of one of the RF signal paths, wherein an electrical signal is connected to the RF circuit board through the aperture.

15. The circuit board of claim 12 further comprising:
a cavity disposed within one of the RF signal paths;
an electronic device disposed within the cavity and in electrical communication with the RF signal path; and
a conductive cap affixed to the RF circuit board and operable to cover the cavity.

16. A process for manufacturing mixed-signal circuit board, comprising the steps of:
cutting individual layers of RF circuit board to shape of one or more RF signal paths;
laminating the individual layers of RF circuit board together;
plating the RF circuit board by substantially encapsulating the RF circuit board in an electrically conductive plating material; and
providing device pockets and interconnection apertures within the RF circuit board.

17. The process of claim 16 further comprising the steps of:
providing a distribution board comprising power and control signal paths; and
mounting the RF circuit board upon the distribution board.

18. The process of claim 16 further comprising the steps of:
providing a distribution board comprising power and control signal paths;
routing power and control signals through the power and control signal paths to the RF board.

19. The process of claim 16 further comprising the steps of:
populating electronic devices within device pockets;
electrically interconnecting the electronic devices with the RF circuit board.

20. The process of claim 16 further comprising the step of sealing a conductive cover over the device pocket to create a shielded cavity.

* * * * *